United States Patent
Streubel et al.

(10) Patent No.: US 8,405,104 B2
(45) Date of Patent: Mar. 26, 2013

(54) LUMINESCENT DIODE CHIP WITH LUMINESCENCE CONVERSION ELEMENT AND ANGULAR FILTER ELEMENT

(75) Inventors: Klaus Streubel, Laaber (DE); Ralph Wirth, Mintraching-Auhof (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 174 days.

(21) Appl. No.: 12/595,356

(22) PCT Filed: May 21, 2008

(86) PCT No.: PCT/DE2008/000869
§ 371 (c)(1),
(2), (4) Date: Oct. 9, 2009

(87) PCT Pub. No.: WO2008/145096
PCT Pub. Date: Dec. 4, 2008

(65) Prior Publication Data
US 2010/0084678 A1   Apr. 8, 2010

(30) Foreign Application Priority Data
May 30, 2007   (DE) .......................... 10 2007 025 092

(51) Int. Cl.
*H01L 33/00* (2010.01)
(52) U.S. Cl. ................. 257/98; 257/80; 438/29; 438/35
(58) Field of Classification Search ............ 257/98, 257/99, 100, 89, 88, 79, 80, 95, 436; 438/22, 438/25, 26, 27, 28, 29, 24, 46, 47, 48, 35, 438/34
See application file for complete search history.

(56) References Cited

U.S. PATENT DOCUMENTS

| | | | |
|---|---|---|---|
| 5,466,950 A | 11/1995 | Sugawara et al. | |
| 5,813,752 A | 9/1998 | Singer et al. | |
| 6,570,187 B1 | 5/2003 | Pautrat et al. | |
| 6,711,195 B2 | 3/2004 | Chang et al. | |
| 6,746,295 B2 | 6/2004 | Sorg | |
| 6,956,247 B1 | 10/2005 | Stockman | |
| 7,135,709 B1 | 11/2006 | Wirth et al. | |
| 7,221,003 B2 | 5/2007 | Ueno et al. | |

(Continued)

FOREIGN PATENT DOCUMENTS

DE   199 18 370 A1   11/2000
DE   10 2005 062 514 A1   3/2007

(Continued)

OTHER PUBLICATIONS

Schnitzer, I., et al., "30% external quantum efficiency from surface textured, thin-film light-emitting diodes," Applied Physics Letters, vol. 63, No. 16, Oct. 18, 1993, 3 pages, American Institute of Physics.

*Primary Examiner* — Ha Tran T Nguyen
*Assistant Examiner* — Thanh Y Tran
(74) *Attorney, Agent, or Firm* — Slater & Matsil, L.L.P.

(57) ABSTRACT

A luminescent diode chip includes a semiconductor body, which produces radiation of a first wavelength. A luminescence conversion element produces radiation of a second wavelength from the radiation of the first wavelength. An angular filter element reflects radiation that impinges on the angular filter element at a specific angle in relation to a main direction of emission back in the direction of the semiconductor body.

31 Claims, 5 Drawing Sheets

U.S. PATENT DOCUMENTS

| | | |
|---|---|---|
| 7,341,878 B2 | 3/2008 | Krames et al. |
| 7,462,878 B2 | 12/2008 | Richter et al. |
| 2002/0180351 A1 | 12/2002 | McNulty et al. |
| 2004/0066363 A1* | 4/2004 | Yamano et al. ............... 345/98 |
| 2004/0238837 A1* | 12/2004 | Jacob et al. ................. 257/99 |
| 2006/0054904 A1 | 3/2006 | Lin et al. |
| 2006/0145172 A1* | 7/2006 | Su et al. ...................... 257/98 |
| 2006/0203468 A1 | 9/2006 | Beeson et al. |
| 2006/0208268 A1 | 9/2006 | Ueno et al. |
| 2007/0023762 A1 | 2/2007 | Gumins et al. |
| 2007/0085100 A1 | 4/2007 | Diana et al. |
| 2007/0296840 A1* | 12/2007 | Takada et al. ............... 348/272 |
| 2008/0035944 A1 | 2/2008 | Eberhard et al. |
| 2008/0121919 A1 | 5/2008 | Krames et al. |
| 2008/0123339 A1* | 5/2008 | Bierhuizen et al. .......... 362/293 |
| 2010/0200886 A1 | 8/2010 | Krames et al. |

FOREIGN PATENT DOCUMENTS

| | | |
|---|---|---|
| EP | 1 643 567 A2 | 4/2006 |
| JP | 07038151 A | 2/1995 |
| JP | 07094781 A | 4/1995 |
| JP | 2001028457 A | 1/2001 |
| JP | 2002536850 A | 10/2002 |
| JP | 2003258384 A | 9/2003 |
| JP | 2004528714 A | 9/2004 |
| JP | 2004281929 A | 10/2004 |
| JP | 2006261540 A | 9/2006 |
| JP | 2006352085 A | 12/2006 |
| TW | 200509487 | 3/2005 |
| WO | WO 98/12757 A1 | 3/1998 |
| WO | WO 98/14986 A1 | 4/1998 |
| WO | WO 2006/035388 A2 | 4/2006 |
| WO | WO 2007/036214 A1 | 4/2007 |
| WO | WO 2008/040298 A1 | 4/2008 |

* cited by examiner

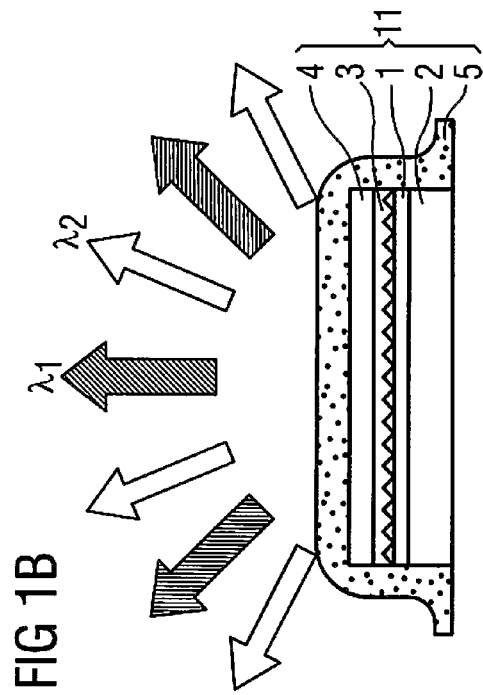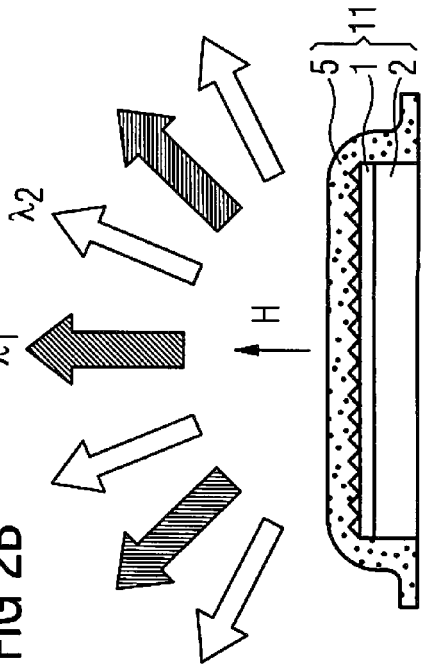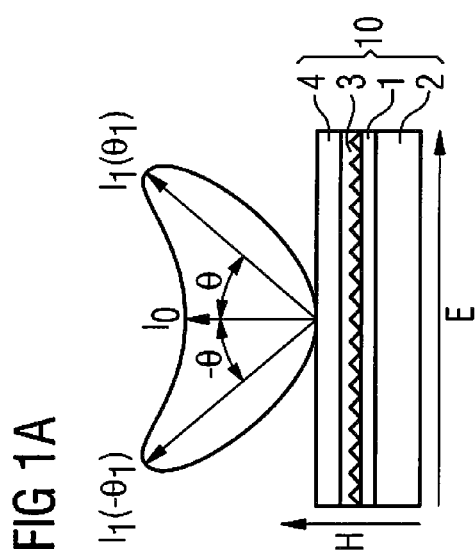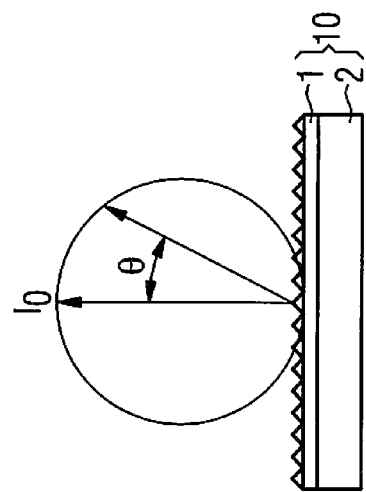

LUMINESCENT DIODE CHIP WITH LUMINESCENCE CONVERSION ELEMENT AND ANGULAR FILTER ELEMENT

This patent application is a national phase filing under section 371 of PCT/DE2008/000869, filed May 21, 2008, which claims the priority of German patent application 10 2007 025 092.6, filed May 30, 2007, each of which is incorporated herein by reference in its entirety.

TECHNICAL FIELD

The invention relates to a luminescent diode chip.

BACKGROUND

With the aid of an LED, which, for example, produces blue light and converts part of the blue light into yellow light by a suitable converter material, white light can be produced because of the resultant color mixing of the original blue light with the converted yellow light. A problem thereby arising is described in DE 199 18 370 A1 (U.S. Pat. No. 6,759,803). On account of different path lengths of light rays within a resin filling surrounding the LED, in which the converter material is contained, the yellow component may predominate in the overall radiation in the peripheral region of a blue element, whereas by contrast the blue component predominates in the middle. According to DE 199 18 370 A1, this problem is solved by creating a uniform path length of the omnidirectionally emitted light radiation by an appropriate shape of the resin filling, to be specific by a convex surface of the resin filling.

SUMMARY

In one aspect the present invention provides a luminescent diode chip with a uniform color location.

A luminescent diode chip according to the invention comprises a semiconductor body, which produces radiation of a first wavelength, and a luminescence conversion element, which produces from the radiation of the first wavelength, radiation of a second wavelength, and an angular filter element, which reflects radiation that impinges on the angular filter element in a predetermined angular range in relation to a main direction of emission at least partially back in the direction of the semiconductor body.

The luminescent diode chip can be advantageously used to produce an overall mixed-color radiation, for example, white light, which is made up of suitable components of radiation of the first wavelength and of the second wavelength in such a way that a viewer can distinguish a color impression caused by the overall mixed-color radiation both from the color impression caused by the radiation of the first wavelength and from the color impression caused by the radiation of the second wavelength.

The predetermined angular range indicates, in particular, the angular range in which a specific radiation component would be perceptible for a viewer if no angular filter element were used. Alternatively, it would also be conceivable to choose the predetermined angular range as the angular range with which a specific radiation component would be perceptible as underrepresented for a viewer without the angular filter element. The overall radiation emitted by the luminescent diode chip has, in particular, radiation components of the first wavelength and of the second wavelength. Preferably, the first and second wavelengths correspond to two different colors that are complementary to each other. Taking the example mentioned at the beginning, the predetermined angular range indicates in the present case the angular range with which the viewer would, without the angular filter element, perceive a colder white light on account of a greater blue component and a lesser yellow component in the overall radiation. The predetermined angular range is preferably arranged symmetrically in relation to the main direction of emission.

According to a preferred embodiment, an angular filter element that reflects at least part of the radiation of the first wavelength back in such a way that an overall radiation emitted by the luminescent diode chip has a uniform color location independently of the angle that is used. This can be made possible by, inter alia, the radiation of the first wavelength that leaves the luminescent diode chip being attenuated by means of the reflection at the angular filter element.

According to a further preferred embodiment, radiation of the first wavelength may be reflected back in the direction of the semiconductor body by means of the angular filter element. Advantageously, the radiation reflected back is absorbed in the semiconductor body and emitted again, which is referred to as "photon recycling". The radiation reflected back is therefore not lost, but can leave the semiconductor body after reemission when it impinges on the angular filter element at a different angle. The angles at which the ratio between the radiation of the first wavelength and the radiation of the second wavelength is balanced, so that the overall radiation emitted by the component has the desired color location, are advantageous here. By means of the angular filter element, an emission profile of the luminescent diode chip is preferably changed in such a way that a radiation intensity is reduced in the predetermined angular range and increased at the other angles.

One possible arrangement of the angular filter element is to arrange it on the semiconductor body in direct contact with the same or at a distance from it. Furthermore, the luminescence conversion element may be arranged on the angular filter element. The luminescence conversion element is preferably arranged downstream of the angular filter element in the main direction of emission.

Advantageously, the angular filter element in this arrangement is suitable for reflecting both radiation of the first wavelength impinging on the rear side and radiation of the second wavelength impinging on the front side. Consequently, the angular filter element can reflect radiation of the second wavelength, which is produced in the luminescence conversion element and emitted isotropically in all directions, in the direction of a coupling-out side of the luminescent diode chip. As a result, the efficiency of the luminescent diode chip can be increased.

According to a preferred embodiment, the luminescence conversion element is a luminescence conversion layer applied to the angular filter element. With uniform thickness of the luminescence conversion layer and omnidirectional emission of the semiconductor body, an increased component of the radiation of the first wavelength in a direction perpendicular to a surface of the semiconductor body would be expected without the angular filter element, on account of the angle-dependent path length. The optical effect of the angular filter element can be advantageously adapted to a given shape of the luminescence conversion element, so that the luminescence conversion element may in principle be variously formed.

According to a further preferred embodiment, the luminescence conversion element is a casting compound, which contains at least a luminescence conversion material and in which the angular filter element and the semiconductor body are embedded. The luminescence conversion material is preferably distributed homogeneously in the casting compound.

The luminescence conversion material is intended for the wavelength conversion of at least part of the radiation of the first wavelength emitted by the semiconductor body to greater wavelengths, in particular, the second wavelength. Suitable luminescence conversion materials, such as, for example, YAG:Ce, are known from WO 98/12757 (U.S. Pat. No. 6,066, 861), the content of which is hereby incorporated by reference, in particular with respect to luminous materials. The luminescence conversion element is advantageously a layer of plastic, preferably with a layer of silicone, in which the at least one luminescence conversion material is embedded in the manner of a matrix. The luminescence conversion element is advantageously applied to the radiation outlet area of the semiconductor body in the form of a layer by a screen printing process.

A further possibility for arranging the angular filter element is to arrange it downstream of the luminescence conversion element, the luminescence conversion element being arranged on the semiconductor body in direct contact with it or at a distance from it. The angular filter element is preferably arranged downstream of the luminescence conversion element in the main direction of emission.

According to a preferred embodiment, the angular filter element is a dielectric filter. Advantageously, reflection and transmission properties of the angular filter element, which contains dielectric materials or is a dielectric filter, can be set by choice of the materials and the construction of the angular filter element.

With preference, the angular filter element comprises a stack of layers made up of at least two layers with different refractive indexes. With particular preference, the refractive index alternates when there are more than two layers, that is to say that a first layer and a third layer have a first refractive index, whereas a second layer arranged between the first layer and the third layer has a second refractive index that is different from the first refractive index. At the transition between two layers with different refractive indexes, part of the radiation is reflected and part of the radiation, preferably corresponding to the non-reflected radiation component, is transmitted, so that there are scarcely any losses by absorption.

Silicon-containing materials are suitable for the dielectric filter. For example, a first layer may contain a silicon oxide and a second layer may contain a silicon nitride. Furthermore, titanium-containing materials may also be used for the dielectric filter. For example, a first layer may contain a silicon oxide and a second layer may contain a titanium oxide.

According to a preferred embodiment, the angular filter element is a Bragg reflector. Here, the layers from which the Bragg reflector is formed are of a suitable thickness, so that interference effects are advantageously used. Preferred layer thicknesses lie in the range between one quarter and three quarters of the first wavelength, the wavelength having to be understood as being the wavelength in the respective medium.

Furthermore, any element that has an increased degree of reflection, in particular, for smaller angles of incidence and an increased degree of transmission for greater angles of incidence comes into consideration as the angular filter element. For example, the angular filter element may be an element with a surface structure that is suitable for reflecting impinging light rays to different degrees in accordance with their angle of incidence. The surface structure may comprise a plurality of structural elements that are preferably arranged regularly on a surface of the angular filter element. Possible forms for the structural elements are conical, pyramidal or prismatic solid or hollow bodies.

According to an advantageous refinement, the wavelength of the radiation reflected back in the direction of the semiconductor body is at a long-wave flank of a stop band of the angular filter element. As a result, the angular filter element reflects light rays that impinge on the angular filter element at a relatively small angle of incidence, since they still lie in the stop band, whereas light rays at a greater angle of incidence are transmitted.

According to an alternative embodiment, the wavelength of the radiation reflected back in the direction of the semiconductor body is within a stop band of the angular filter element. Here, too, light rays that impinge on the angular filter element at small angles of incidence are reflected, whereas light rays that impinge on the angular filter element at greater angles of incidence are transmitted.

In the case of a further advantageous embodiment, the semiconductor body is a thin-film semiconductor body. In the production of a thin-film semiconductor body, a functional semiconductor layer sequence, which comprises, in particular, a radiation-emitting active layer, is initially grown epitaxially on a growth substrate, after which a new carrier is applied to the surface of the semiconductor layer sequence lying opposite the growth substrate and then the growth substrate is detached. Since the growth substrates that are used for nitride compound semiconductors, for example, SiC, sapphire or GaN, are comparatively expensive, this method offers the advantage, in particular, that the growth substrate is reusable. The detachment of a sapphire growth substrate from a semiconductor layer sequence of a nitride compound semiconductor may be performed, for example, by a laser lift-off method that is known from WO 98/14986 (U.S. Pat. No. 6,559,075).

A basic principle of a thin-film LED is described, for example, in I. Schnitzer, et al., Appl. Phys. Lett. 63 (16), 18 Oct. 1993, 2174-2176, the disclosure content of which is to this extent hereby incorporated by reference.

In particular, the semiconductor body may have an epitaxial layer sequence that is based on nitride compound semiconductors. "Based on nitride compound semiconductors" means in the present context that the active epitaxial layer sequence, or at least one layer thereof, comprises a nitride-III/V-compound semiconductor material, preferably $Al_xGa_yIn_{1-x-y}N$, where $0 \leq x \leq 1$, $0 \leq y \leq 1$ and $x+y \leq 1$. This material does not necessarily have to have a mathematically exact composition in accordance with the above formula. Rather, it may have one or more dopants and additional constituents that do not substantially alter the characteristic physical properties of the $Al_xGa_yIn_{1-x-y}N$ material. For the sake of simplicity, however, the above formula just comprises the main constituents of the crystal lattice (Al, Ga, In, N), even though they may be partly substituted by small amounts of further substances.

According to a further embodiment of the luminescent diode chip, a reflective layer is arranged on a side of the semiconductor body that is facing away from the angular filter element. By means of the reflective layer, which preferably reflects impinging rays back in the direction of the semiconductor body, whereby photon recycling is in turn possible, the efficiency of the luminescent diode chip can be further increased.

A luminescent diode component according to the invention has a luminescent diode chip according to one of the exemplary embodiments described, the luminescent diode chip being arranged in a package.

BRIEF DESCRIPTION OF THE DRAWINGS

Further features, advantages and developments of the invention emerge from the following exemplary embodiments explained in conjunction with FIGS. 1 to 6, in which:

FIG. 1A shows a semiconductor chip suitable for a luminescent diode chip according to a first embodiment of the invention and FIG. 1B shows a luminescent diode chip according to a first embodiment of the invention;

FIG. 2A shows a conventional semiconductor chip without an angular filter element and FIG. 2B shows a conventional luminescent diode chip without an angular filter element;

DETAILED DESCRIPTION OF ILLUSTRATIVE EMBODIMENTS

Figure 3A:
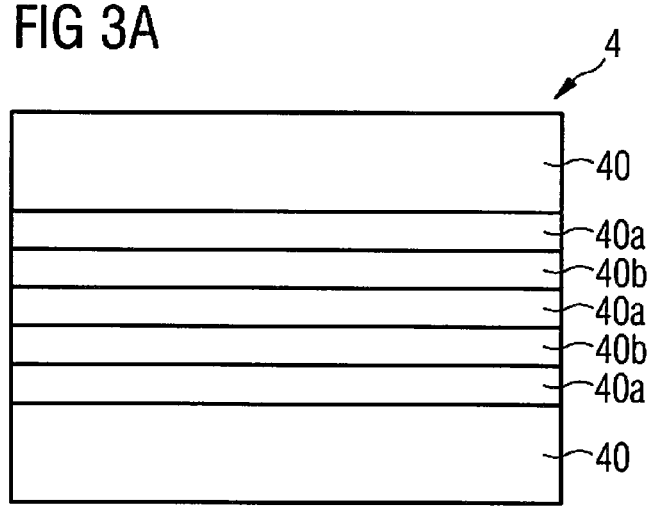
FIG. 3A shows an angular filter element according to a first preferred embodiment and FIG. 3B shows a spectrum of reflection angles of the angular filter element that is represented in FIG. 3A.

The semiconductor chip 10 that is represented in FIG. 1A has a semiconductor body 1 and an angular filter element 4. The angular filter element 4 is arranged downstream of the semiconductor body 1 in a main direction of emission H. The main direction of emission H runs parallel to the direction of growth, in which layers that form the semiconductor body 1 (not represented) are grown. Furthermore, the main direction of emission H runs perpendicular to a main plane of extent E, which is defined by the two longest edges of the semiconductor chip 10.

The semiconductor body 1 is a thin-film semiconductor body with a Lambert emission characteristic, which means that an intensity maximum occurs in the main direction of emission H ($\theta=0°$) when no angular filter element is present. With the angular filter element 4, however, a semiconductor chip 10 has a radiation characteristic that is compressed in comparison with the Lambert emission characteristic. Thus, an intensity value $I_0$ occurring in the main direction of emission H is smaller than an intensity value $I_1$ occurring at an angle $\theta_1$ or $-\theta_1$. This has the advantage that the radiation emitted in the main direction of emission H of a luminescent diode chip 11 such as that represented in FIG. 1B, which has a luminescence conversion element 5 of uniform thickness on the coupling-out side, is weakened in comparison with a conventional luminescent diode chip (see FIG. 2B). This has the consequence that an overall radiation emitted by the luminescent diode chip 11 has a uniform color location in an angular range $[-\theta, \theta]$, the angular range preferably extending from $-90°$ to $90°$.

The semiconductor body 1 represented in FIG. 1A is connected on the rear side to a carrier 2 that is different from the growth substrate. The carrier 2 preferably contains a material with high thermal conductivity, for example, a material containing Si such as SiC. Furthermore, a high electrical conductivity of the carrier 2 may be of advantage, so that a rear-side electrical connection of the semiconductor chip 10 by means of the carrier 2 is possible.

The semiconductor body 1 is roughened on the front side. The rough surface makes better coupling out of the radiation produced in an active zone of the semiconductor body 1 possible in comparison with a flat surface. However, layers can become detached more easily from a roughened surface than from a smooth surface. Therefore, the roughened semiconductor body 1 is provided with a planarizing layer 3. The planarizing layer 3 preferably contains a material that is transparent to the radiation produced in the semiconductor body 1. For example, $SiO_2$ may be used for the planarizing layer 3.

The angular filter element 4 is preferably a dielectric filter that has a number of layers with different refractive indexes. The layers may be applied one after the other to the planarizing layer 3, for example, by sputtering. Alternatively, a separate, prefabricated angular filter element 4 may be arranged on the planarizing layer 3. Possible angular filter elements are described in conjunction with FIGS. 3A, 4A and 5A.

The luminescent diode chip 11 that is represented in FIG. 1B is constructed in the same way as the semiconductor chip 10 that is represented in FIG. 1A, but additionally has the luminescence conversion element 5. The luminescence conversion element 5 is a sealing in which the remaining semiconductor chip is embedded. The sealing contains luminescence conversion materials for the wavelength conversion of at least part of the radiation of the first wavelength $\lambda_1$ emitted by the semiconductor body 1 to greater wavelengths, in particular the second wavelength $\lambda_2$. As indicated by arrows, the radiation of the first wavelength $\lambda_1$ emitted in the main direction of emission H is equal in intensity to the radiation emitted at different angles.

By contrast with this, in the case of a conventional chip 10 without an angular filter element, as represented in FIG. 2A, the intensity of the radiation is at a maximum in the main direction of emission H, which in the case of a conventional luminescent diode chip 10 with the luminescence conversion element 5 has the effect that the radiation of the first wavelength $\lambda_1$ likewise has an intensity maximum in the main direction of emission H. This effect is further enhanced by an optical path through the luminescence conversion element 5 being at its shortest in the main direction of emission. This has the consequence that less radiation of the first wavelength $\lambda_1$ is converted into radiation of the second wavelength $\lambda_2$ in the main direction of emission H.

FIG. 3A shows a first preferred embodiment of an angular filter element 4. This is a dielectric multilayer filter. The angular filter element 4 has a plurality of layers, which differ from one another by their material or layer thickness. In particular, the layers 40a and 40b may be of a layer thickness that is $\lambda_1/4n$, where n is the refractive index of a respective layer material. Suitable materials are $SiO_2$, with a refractive index of $n_1=1.5$, for the layers 40 and 40b and SiN, with a refractive index of $n_2=2.0$, for the layers 40a. The refractive index n changes periodically within the angular filter element 4. The angular filter 4 comprises three periods of an $SiO_2$/SiN Bragg reflector. However, the angular filter element 4 is not restricted to this number of periods. Rather, the number of layers is dependent on a desired characteristic of the spectrum of reflection angles.

The angular filter element 4 that is represented in FIG. 3A is tuned for a design wavelength $\lambda_D$ that is less than the wavelength $\lambda_1$ of the radiation produced by the semiconductor body. In other words, the design wavelength $\lambda_D$ lies within a pass band of the angular filter element 4. Furthermore, the angular filter element 4 is detuned with respect to the wavelength $\lambda_1$, or in other words the wavelength $\lambda_1$ lies at a long-wave flank of a stop band of the angular filter element 4. As a result, the angular filter element 4 reflects light rays that impinge on the angular filter element 4 at smaller angles of incidence, whereas light rays that impinge on the angular filter element 4 at greater angles of incidence are transmitted. In particular, the wavelength $\lambda_1$ is approximately 460 nm, whereas the design wavelength $\lambda_D$ is approximately 400 nm.

Figure 3B:
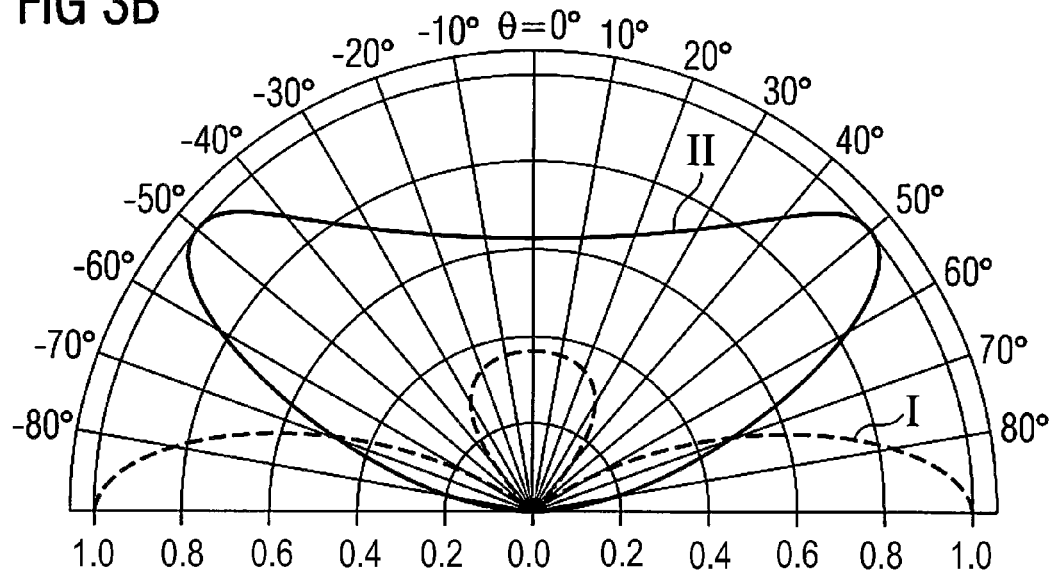

The diagram according to FIG. 3B shows the spectrum of reflection angles of the angular filter element 4 that is represented in FIGS. 3A. The dashed curve I graphically represents an intensity reflection factor for all angles θ, where $-90° \leq \theta \leq 90°$. The solid curve II graphically represents an intensity transmission factor for the same angular range. As revealed by FIG. 3B, the transmission in the main direction of emission, that is to say with the angle θ=0°, is significantly attenuated, or the reflectivity is significantly increased. This behavior is reversed in an angular range of approximately $30° \leq \theta \leq 60°$ or $-60° \leq \theta \leq -30°$.

Approximately 40% of light rays that impinge on the angular filter element 4 at smaller angles of incidence, that is to say form an included angle of $-30° \leq \theta \leq 30°$ with the main direction of emission, are reflected, whereas 80% to 100% of light rays that impinge on the angular filter element at greater angles of incidence, that is to say form an included angle of $-60° \leq \theta \leq -30°$ with the main direction of emission, are transmitted.

In the case of this exemplary embodiment, the predetermined angular range is $[-30°, 30°]$.

Figure 4A:
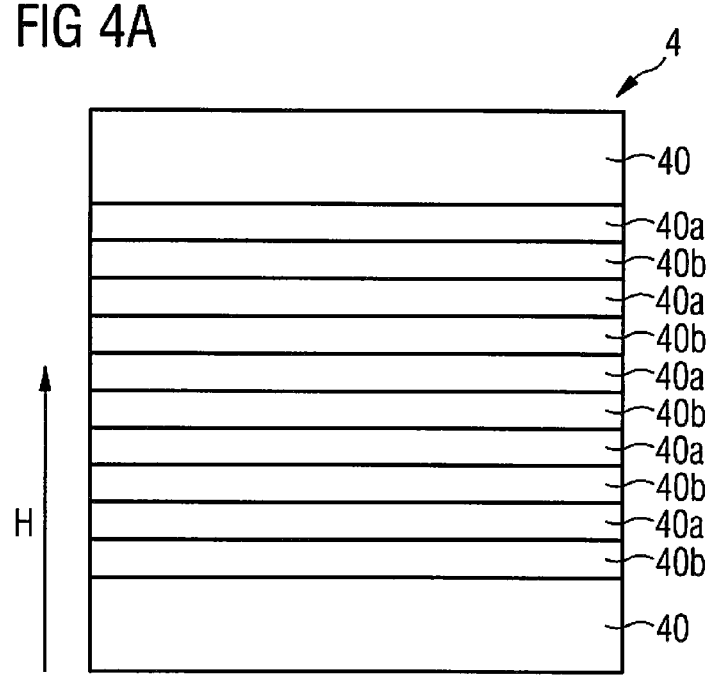
FIG. 4A shows an angular filter element according to a second preferred embodiment and FIG. 4B shows a spectrum of reflection angles of the angular filter element that is represented in FIG. 4A.

A further exemplary embodiment of an angular filter element 4 is shown in FIG. 4A. This angular filter element 4 is also a dielectric multilayer filter. The layers of the angular filter element 4 are arranged in such a way that a first refractive index $n_1$ and a second refractive index $n_2$ occur periodically. Altogether, the angular filter element 4 has five such periods between the two layers 40. Preferably, the layers 40 and 40b contain a material with the same refractive index $n_1$, whereas the layers 40a have material with the refractive index $n_2$. In particular, it is $n_2 > n_1$. For example, the refractive indexes are $n_1=1.5$ and $n_2=2.0$. Suitable materials are $SiO_2$ for the layers 40 and 40b and SiN for the layers 40a.

The layer thickness is, in particular, $\lambda_1/4n_2$ for the layers 40a and $\lambda_1/4n_1$ for the layers 40b. Advantageously, as a result, light rays that impinge on the angular filter element 4 in the main direction of emission H and are reflected at transitions between the layers 40a and 40b structurally interfere. This is so because the optical path difference between two reflected light rays is $\Delta\phi=0$, where the first light ray is reflected at a first layer 40b/layer 40a transition and the second light ray is reflected at a downstream second layer 40a/layer 40b transition. This is caused by the fact that a phase jump of π occurs at the first transition as a result of the reflection at the optically denser medium, the jump corresponding to the phase shift as a result of a longer path of the second light ray through the layer 40a, which is likewise π.

Figure 4B:
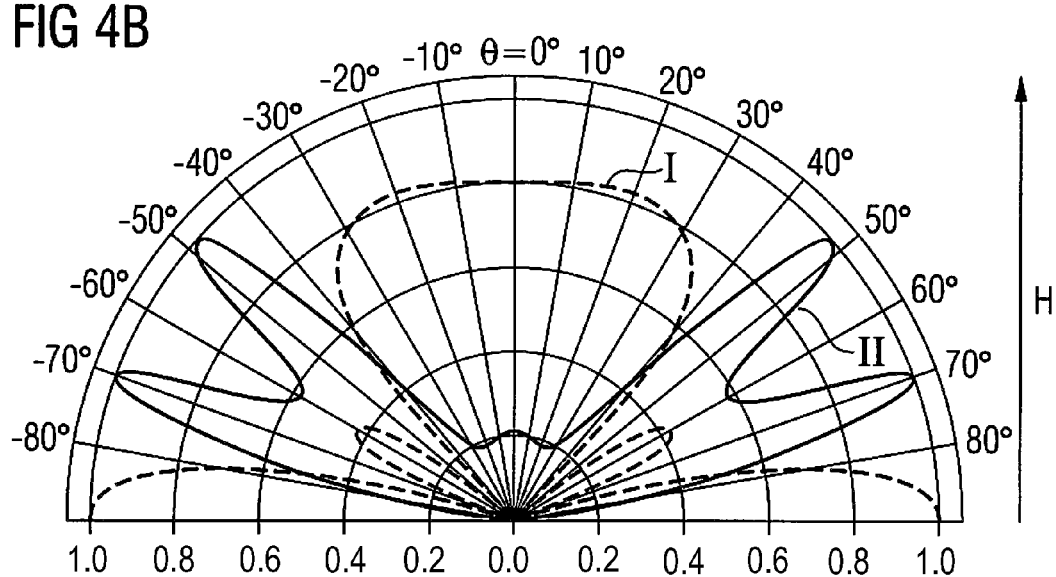

The angular filter element 4 is tuned to the wavelength $\lambda_1$, which means that the wavelength $\lambda_1$ does not lie at a flank of the stop band as in the case of the angular filter element according to FIG. 3A, but lies within the stop band. As represented in FIG. 4B, the angular filter element 4 has a high reflectivity for smaller angles of incidence (see curve I) and a low reflectivity for greater angles of incidence (see curve II).

Figure 5A:
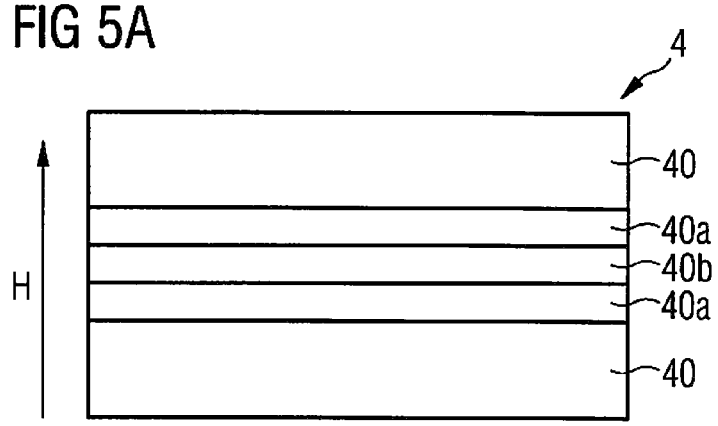
FIG. 5A shows an angular filter element according to a third preferred embodiment

The angular filter element 4 that is represented in FIG. 5A, which is a detuned resonator, is suitable, in particular, for a luminescent diode chip 11 such as that configured in FIG. 1B, in the case of which the luminescence conversion element 5 is arranged downstream of the angular filter element 4. This is so because the angular filter element 4 has a high reflectivity not only for the radiation of the first wavelength $\lambda_1$, which here preferably lies in the blue spectral range, but also for the radiation of the second wavelength $\lambda_2$, which here preferably lies in the yellow spectral range. As revealed by the diagram that is represented in FIG. 5C, in which the intensity reflection factor (see curve I) and the intensity transmission factor (see curve II) are plotted against the wavelength [nm], curve I has a peak A in the blue spectral range and a peak B in the yellow spectral range. Advantageously, the radiation that is emitted by the luminescence conversion element 5 (see FIG. 1B) in the direction of the angular filter element 4 can consequently be reflected by means of the angular filter element 4 in the direction of a coupling-out side of the luminescent diode chip 11.

The angular filter element 4 has a layer sequence such as that shown in FIG. 5A, which comprises the layers 40 and 40b with a first identical refractive index $n_1$ and the layers 40a with a second refractive index $n_2$, which is greater than the first refractive index $n_1$. In particular, the layers 40 and 40b contain $SiO2$ with the refractive index $n_1=1.5$, whereas the layers 40a comprise $TiO_2$ with the refractive index $n_2=2.0$. Suitable layer thicknesses are $\lambda_1/4n_2$ for the layers 40a and $5\lambda_1/8n_1$ for the layer 40b.

Figure 5B:
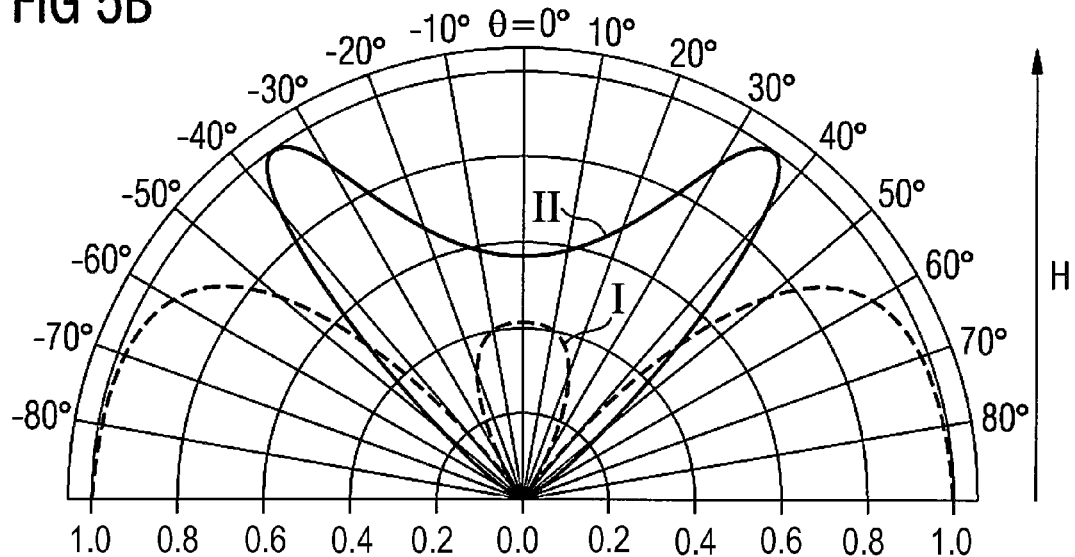
FIG. 5B shows a spectrum of reflection angles of the angular filter element that is represented in FIG. 5A
Figure 5C:
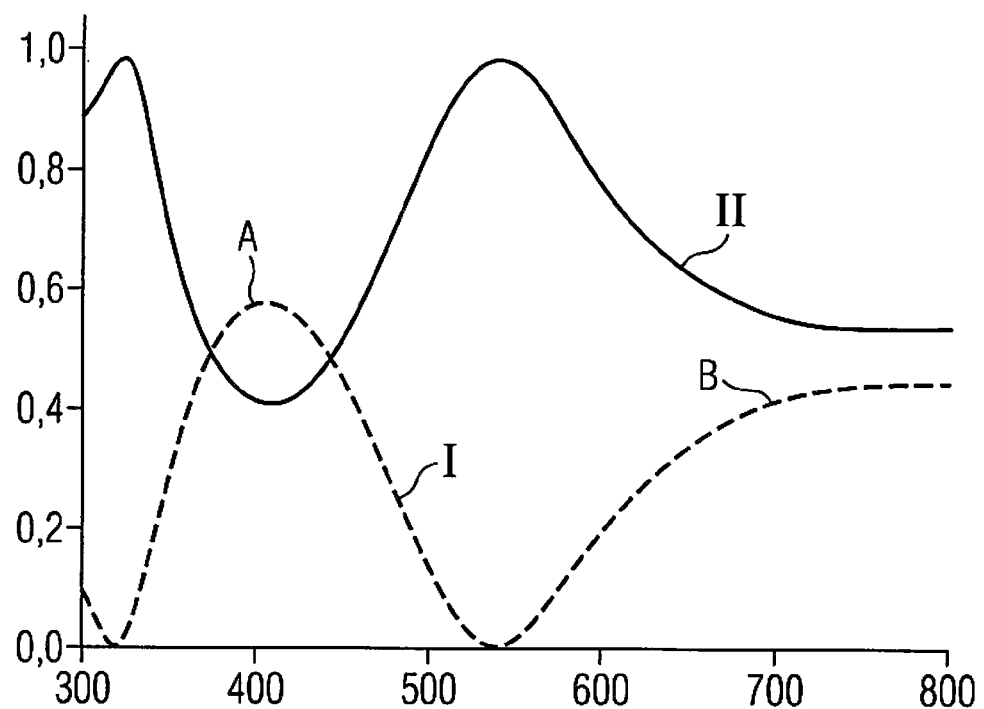
FIG. 5C shows a wavelength-dependent spectrum of reflection angles of the angular filter element that is represented in FIG. 5A.

The spectrum of reflection angles of the angular filter element 4 according to FIG. 5A is represented in FIG. 5B. As in the previous exemplary embodiments, here too the intensity reflection factor (see curve I) is higher for smaller angles of incidence than for greater angles of incidence. This results in an intensity transmission spectrum (see curve 2) and an associated emission characteristic that is compressed in comparison with the Lambert emission characteristic in the range of smaller angles of incidence.

Figure 6:
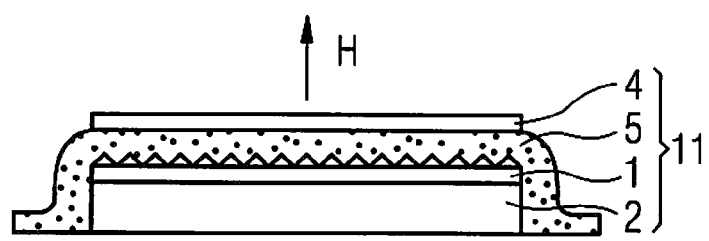
FIG. 6 shows a luminescent diode chip according to a second embodiment of the invention.

FIG. 6 shows a further exemplary embodiment of a luminescent diode chip 11. Here, the angular filter element 4 is arranged downstream of the luminescence conversion element 5 in the main direction of emission H. Consequently, photon recycling can already take place in the luminescence conversion element 5. This is because the radiation reflected by the angular filter element 4 back in the direction of the semiconductor body 1 can be absorbed in the luminescence conversion element 5 and re-emitted before the radiation reflected back enters the semiconductor body 1. Typically, the radiation absorbed in the luminescence conversion element 5 is re-emitted at a greater wavelength $\lambda_2$. If the angular filter element 4 shows an increased reflectivity only for the radiation of the wavelength $\lambda_1$, the luminescent diode chip 11 according to FIG. 6 has an increased proportion of the radiation $\lambda_2$ in the overall radiation in comparison with the luminescent diode chip 11 that is represented in FIG. 1B.

The invention is not restricted to the description given on the basis of the exemplary embodiments. Rather, the invention comprises every novel feature and every combination of features, which includes, in particular, every combination of features in the patent claims, even if the feature or combination concerned is not explicitly specified in the patent claims or exemplary embodiments.

The invention claimed is:

1. A luminescent diode chip comprising:
    a semiconductor body that produces radiation of a first wavelength;
    a luminescence conversion element that produces radiation of a second wavelength from the radiation of the first wavelength; and
    an angular filter element that reflects radiation that impinges on the angular filter element in a predetermined angular range in relation to a main direction of emission at least partially back in the direction of the semiconductor body, wherein, at the first wavelength, the angular filter element has a greater intensity reflection factor for smaller angles of incidence than larger angles of incidence, and wherein, at the first wavelength, the angular filter element has a lower intensity transmission factor for smaller angles of incidence than larger angles of incidence.

2. The luminescent diode chip according to claim 1, wherein the angular filter element reflects at least part of the radiation of the first wavelength back in such a way that an overall radiation emitted by the luminescent diode chip has a uniform color location independent of angle.

3. The luminescent diode chip according to claim 2, wherein the overall radiation emitted by the luminescent diode chip has radiation components of the first wavelength and of the second wavelength.

4. The luminescent diode chip according to claim 1, wherein the angular filter element reflects radiation of the first wavelength back in the direction of the semiconductor body.

5. The luminescent diode chip according to claim 1, wherein the angular filter element is arranged on the semiconductor body and the luminescence conversion element is arranged downstream of the angular filter element in the main direction of emission.

6. The luminescent diode chip according to claim 5, wherein the luminescence conversion element comprises a luminescence conversion layer applied to the angular filter element.

7. The luminescent diode chip according to claim 6, wherein the luminescence conversion element comprises a sealing, which contains a luminescence conversion material and in which the angular filter element and the semiconductor body are embedded.

8. The luminescent diode chip according to claim 1, wherein the angular filter element reflects radiation of the second wavelength in the direction of a coupling-out side of the luminescent diode chip.

9. The luminescent diode chip according to claim 1, wherein the luminescence conversion element is arranged on the semiconductor body and the angular filter element is arranged downstream of the luminescence conversion element in the main direction of emission.

10. The luminescent diode chip according to claim 9, wherein the luminescence conversion element comprises a luminescence conversion layer applied to the semiconductor body.

11. The luminescent diode chip according to claim 1, wherein the angular filter element comprises a dielectric filter.

12. The luminescent diode chip according to claim 1, wherein the angular filter element comprises a stack of layers made up of at least two layers with different refractive indexes.

13. The luminescent diode chip according to claim 12, wherein the stack of layers comprises a first layer that comprises silicon oxide and a second layer that comprises silicon nitride.

14. The luminescent diode chip according to claim 1, wherein the angular filter element comprises a Bragg reflector.

15. The luminescent diode chip according to claim 1, wherein the angular filter element has structural elements.

16. The luminescent diode chip according to claim 15, wherein the structural elements are formed in a conical, pyramidal or prismatic manner.

17. The luminescent diode chip according to claim 1, wherein the radiation reflected back in the direction of the semiconductor body has a wavelength that is at a long-wave flank of a stop band of the angular filter element.

18. The luminescent diode chip according to claim 1, wherein the radiation reflected back in the direction of the semiconductor body has a wavelength that is within a stop band of the angular filter element.

19. The luminescent diode chip according to claim 1, wherein the semiconductor body comprises a thin-film semiconductor body.

20. The luminescent diode chip according to claim 1, further comprising a reflective layer arranged on a side of the semiconductor body that is facing away from the angular filter element.

21. A luminescent diode component comprising a luminescent diode chip according to claim 1, the luminescent diode chip being arranged in a package.

22. The luminescent diode chip according to claim 1, wherein, at the first wavelength, the intensity transmission factor of the angular filter element varies over the greater angles of incidence.

23. The luminescent diode chip according to claim 22, wherein the intensity transmission factor of the angular filter element has more than one maximum value over the greater angles of incidence.

24. A luminescent diode chip comprising:
a semiconductor body that produces radiation of a first wavelength;
a luminescence conversion element that produces radiation of a second wavelength from the radiation of the first wavelength; and
an angular filter element that reflects radiation that impinges on the angular filter element in a predetermined angular range in relation to a main direction of emission at least partially back in the direction of the semiconductor body, wherein the angular filter element reflects at least part of the radiation of the first wavelength back in such a way that an overall radiation emitted by the luminescent diode chip has a uniform color location independent of angle, wherein, at the first wavelength, the angular filter element has a lower intensity transmission factor for smaller angles of incidence than larger angles of incidence.

25. The luminescent diode chip according to claim 24, wherein the radiation of the first wavelength that leavers the luminescent diode chip is attenuated by means of the reflection of the angular filter element.

26. The luminescent diode chip according to claim 24, wherein the angular filter element comprises a stack of layers made up of at least two layers with different refractive indices.

27. A luminescent diode chip comprising:
a semiconductor body that produces radiation of a first wavelength;
a luminescence conversion element that produces radiation of a second wavelength from the radiation of the first wavelength; and
an angular filter element that reflects radiation that impinges on the angular filter element in a predetermined angular range in relation to a main direction of emission at least partially back in the direction of the semiconductor body, wherein, at the first wavelength, the angular filter element has a greater intensity reflection factor over a first angular range than over a second angular range, wherein the first angular range is located between the main direction of emission and the second angular range, wherein the first angular range is a range of angles from the main direction of emission less than 30°, and wherein the second angular range is a range of angles from the main direction of emission of 30° to about 60°.

28. The luminescent diode chip according to claim 27, wherein, at the first wavelength, the angular filter element has a greater intensity reflection factor over a third angular range than the second angular range, and wherein the third angular range is a range of angles from the main direction of emission greater than 70°.

29. A luminescent diode chip comprising: a semiconductor body that produces radiation of a first wavelength; wherein, at the first wavelength, the angular filter element has a lower intensity transmission factor over the first angular range than over the second angular range.

30. The luminescent diode chip according to claim 29, wherein, at the first wavelength, the intensity transmission factor of the angular filter element varies over the second angular range.

31. The luminescent diode chip according to claim 30, wherein the intensity transmission factor of the angular filer element has more than one maximum value over the second angular range.

* * * * *

UNITED STATES PATENT AND TRADEMARK OFFICE
CERTIFICATE OF CORRECTION

PATENT NO. : 8,405,104 B2
APPLICATION NO. : 12/595356
DATED : March 26, 2013
INVENTOR(S) : Streubel et al.

It is certified that error appears in the above-identified patent and that said Letters Patent is hereby corrected as shown below:

In the Claims

In Col. 11, line 11, claim 29, after "wavelength;" insert --a luminescence conversion element that produces radiation of a second wavelength from the radiation of the first wavelength; and an angular filter element that reflects radiation that impinges on the angular filter element in a predetermined angular range in relation to a main direction of emission at least partially back in the direction of the semiconductor body, wherein, at the first wavelength, the angular filter element has a greater intensity reflection factor over a first angular range than over a second angular range, wherein the first angular range is located between the main direction of emission and the second angular range,--.

In Col. 12, line 8, claim 31, delete "filer" and insert --filter--.

Signed and Sealed this
First Day of October, 2013

Teresa Stanek Rea
*Deputy Director of the United States Patent and Trademark Office*

UNITED STATES PATENT AND TRADEMARK OFFICE
CERTIFICATE OF CORRECTION

PATENT NO.        : 8,405,104 B2                                    Page 1 of 1
APPLICATION NO.   : 12/595356
DATED             : March 26, 2013
INVENTOR(S)       : Streubel et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 193 days.

Signed and Sealed this
First Day of September, 2015

Michelle K. Lee
*Director of the United States Patent and Trademark Office*